(12) United States Patent
Lin et al.

(10) Patent No.: US 11,350,518 B2
(45) Date of Patent: May 31, 2022

(54) METHOD OF ATTACHING HEAT SINKS TO A CIRCUIT TAPE

(71) Applicant: CHIPBOND TECHNOLOGY CORPORATION, Hsinchu (TW)

(72) Inventors: Chia-Sung Lin, Taichung (TW); Huan-Kai Chou, Kaohsiung (TW); Chia-Hsin Yen, Kaohsiung (TW); Wen-Fu Chou, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 17 days.

(21) Appl. No.: 16/927,059

(22) Filed: Jul. 13, 2020

(65) Prior Publication Data

US 2021/0227679 A1    Jul. 22, 2021

(30) Foreign Application Priority Data

Jan. 22, 2020 (TW) ................... 109102458

(51) Int. Cl.
*H05K 3/30* (2006.01)
*H05K 1/02* (2006.01)
*H05K 13/04* (2006.01)

(52) U.S. Cl.
CPC ........... *H05K 1/0204* (2013.01); *H05K 3/305* (2013.01); *H05K 13/043* (2013.01)

(58) Field of Classification Search
CPC ........... H05K 1/0204; Y10T 29/49133; B23K 26/40; H01L 23/4275
USPC .................................................. 29/832, 834
See application file for complete search history.

(56) References Cited

U.S. PATENT DOCUMENTS

| | | | | |
|---|---|---|---|---|
| 6,097,602 A | * | 8/2000 | Witchger | ............ H01L 23/4275 361/705 |
| 6,852,573 B2 | * | 2/2005 | Ebihara | ............... H01L 23/3735 257/E23.106 |
| 7,913,734 B2 | * | 3/2011 | Kitada | ................... B23K 26/40 156/379 |

FOREIGN PATENT DOCUMENTS

| | | |
|---|---|---|
| CN | 101193537 A | 6/2008 |
| CN | 101692443 A | 4/2010 |
| CN | 103416107 A | 11/2013 |
| CN | 107960133 A | 4/2018 |
| JP | 11-251483 A | 9/1999 |
| JP | 2002-190555 A | 7/2002 |
| JP | 2007-048858 A | 2/2007 |
| JP | 2008-047560 A | 2/2008 |
| JP | 2008-126114 A | 6/2008 |
| JP | 2009-61498 A | 3/2009 |
| JP | 2009-260359 A | 11/2009 |
| JP | 2010-206072 A | 9/2010 |
| JP | 2012-015282 A | 1/2012 |

(Continued)

OTHER PUBLICATIONS

Taiwanese Notice of Allowance dated Sep. 29, 2020 for Taiwanese Patent Application No. 109102458, 3 pages.

(Continued)

*Primary Examiner* — Donghai D Nguyen
(74) *Attorney, Agent, or Firm* — Demian K. Jackson; Jackson IPG PLLC

(57) ABSTRACT

In a method of heat sink attachment, a heat-sink tape includes a plurality of heat sinks and a flexible carrier, and a holder is provided to allow the heat sinks on the moving heat-sink tape to peel from the flexible carrier and attach to a heat-sink mounting area of a moving circuit tape automatically and successively.

8 Claims, 5 Drawing Sheets

(56) References Cited

FOREIGN PATENT DOCUMENTS

| KR | 10-2016-0016592 A | 2/2016 |
|---|---|---|
| WO | 2012/121022 A1 | 9/2012 |
| WO | 2014/062343 A1 | 4/2014 |
| WO | 2017/110203 A1 | 6/2017 |

OTHER PUBLICATIONS

Korean Office Action dated Aug. 30, 2021 for Korean Patent Application No. 10-2020-0087278, 5 pages.
Japanese Office Action dated Nov. 26, 2021 for Japanese Patent Application No. 2020-120852, 4 pages.
Chinese Office Action dated Jan. 21, 2022 for Chinese Patent Application No. 202010091107.7, 9 pages.

* cited by examiner

METHOD OF ATTACHING HEAT SINKS TO A CIRCUIT TAPE

FIELD OF THE INVENTION

This invention relates to method and device of heat sink attachment to a circuit tape, heat sinks on a moving tape are able to attach to a heat-sink mounting area of a moving circuit tape automatically and successively by using a holder.

BACKGROUND OF THE INVENTION

Because of enhanced performance of electronic products, a chip mounted on a circuit board may cause a high temperature and a heat sink is required to be attached on the circuit board to reduce the high temperature. In the prior art, a nozzle is used to suck the heat sink and moved to above the circuit board to allow the heat sink to align with the circuit board, and then the nozzle is moved downward to release the heat sink such that the heat sink is put on the circuit board.

Heat sink warpage caused by the suction of the nozzle may be occurred easily. The distorted heat sink can't be attached to the circuit board evenly so that the circuit board having distorted heat sink may not meet the specifications. In addition, if the suction of the nozzle is too weak or disappeared during conveying the heat sink, the heat sink may fall on incorrect area of the circuit board or fall on machine to result in a decrease of product yield.

SUMMARY

One object of the present invention is to provide a holder to allow each of heat sinks on a moving heat-sink tape to peel from a flexible carrier of the heat-sink tape and attach to a heat-sink mounting area of a moving circuit tape automatically and successively.

A method of heat sink attachment of the present invention includes the steps of: conveying a circuit tape along a first direction, the circuit tape includes a plurality of circuit board units, a heat-sink mounting area is defined on each of the circuit board units; and installing a heat-sink tape on a holder, the holder is located above the circuit tape and includes an abutment portion, a gap exists between the abutment portion and the circuit tape, the heat-sink tape includes a flexible carrier and a plurality of heat sinks attached to a top surface of the flexible carrier temporarily by an adhesive layer, the heat-sink tape is placed on the abutment portion via a bottom surface of the flexible carrier, the flexible carrier is provided to convey the heat sinks successively along a second direction intersecting with the first direction and is moved through the gap and toward a direction of an included angle between the first and second directions after passing through the abutment portion, the adhesive layer under a front end and a back end of each of the heat sinks is peeled from the flexible carrier when the front end and the back end of each of the heat sinks are passed through the abutment portion successively such that each of the heat sinks is able to separate from the flexible carrier, and the front end and the back end of each of the heat sinks separated from the flexible carrier successively are able to attach to the heat-sink mounting area of each of the circuit board units successively by the adhesive layer.

A device of heat sink attachment of the present invention includes a conveyor and a holder. The conveyor is provided to convey a circuit tape having a plurality of unit board units along a first direction, a heat-sink mounting area is defined on each of the circuit board units. The holder is located above the conveyor and includes an abutment portion, a gap exists between the abutment portion and the circuit tape. The abutment portion is provided to hold a flexible carrier that is provided to convey a plurality of heat sinks along a second direction intersecting with the first direction, each of the heat sinks is attached to the flexible carrier temporarily by an adhesive layer. The abutment portion is provided to allow each of the heat sinks to peel from the flexible carrier successively and attach to the heat-sink mounting area of each of the circuit board units successively when the flexible carrier passing through the abutment portion moves through the gap and toward a direction of an included angle between the first and second directions.

After passing the abutment portion of the holder, each of the heat sinks on the moving heat-sink tape is able to be peeled from the flexible carrier and be attached to the heat-sink mounting area of the moving circuit tape by the adhesive layer automatically and successively. The present invention resolves the problems resulted from a nozzle used to suck heat sinks in the prior art, such as heat sink warpage and misplacement caused by abnormal suction.

DETAILED DESCRIPTION OF THE INVENTION

Figure 1:
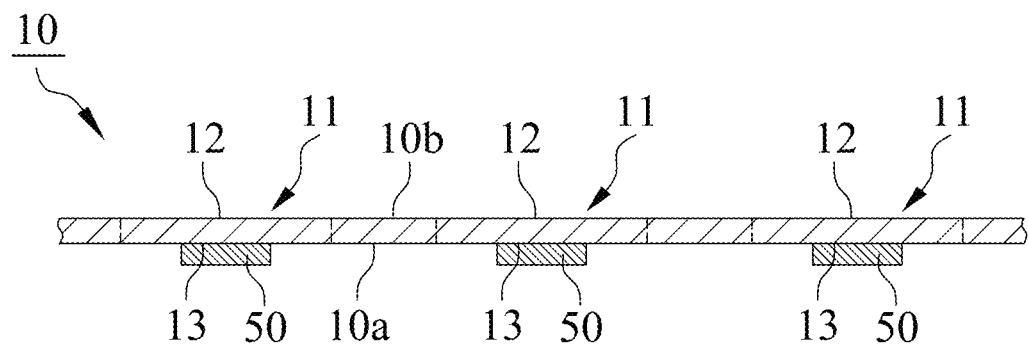
FIG. 1 is a cross-section view diagram illustrating a circuit tape in accordance with an embodiment of the present invention.
Figure 2:
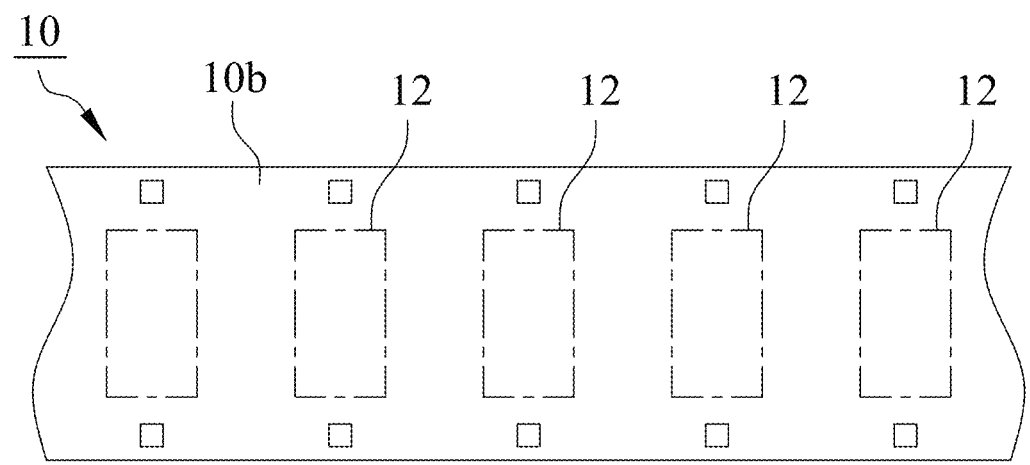
FIG. 2 is a top view diagram illustrating a circuit tape in accordance with an embodiment of the present invention.

With reference to FIGS. 1 and 2, a plurality of chips 50 are provided to be mounted on a circuit tape 10 that includes a plurality of circuit board units 11. A heat-sink mounting area 12 and a chip mounting area 13 are defined on each of the circuit board units 11. In this embodiment, the chip mounting area 13 is defined on a first surface 10a of the circuit tape 10 and the heat-sink mounting area 12 is defined on a second surface 10b of the circuit tape 10. Each of the chips 50 is mounted on the chip mounting area 13 of each of circuit board units 11 respectively, and a heat sink is attached to the heat-sink mounting area 12 of each of circuit board units 11.

Figure 3:
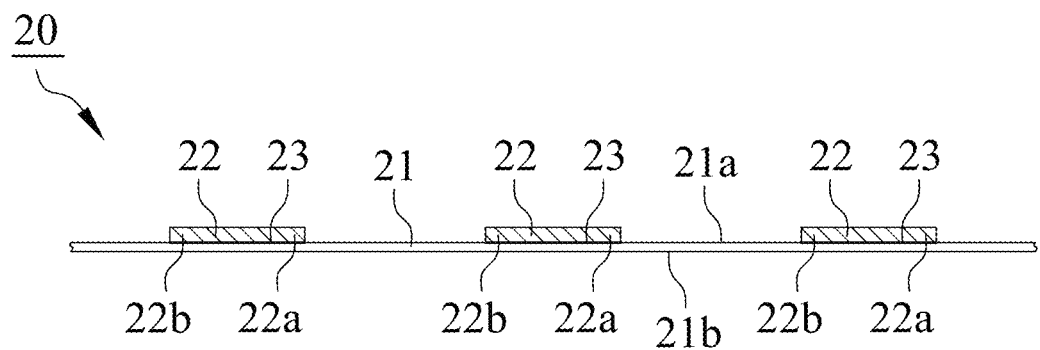
FIG. 3 is a cross-section view diagram illustrating a heat-sink tape in accordance with an embodiment of the present invention.
Figure 4:
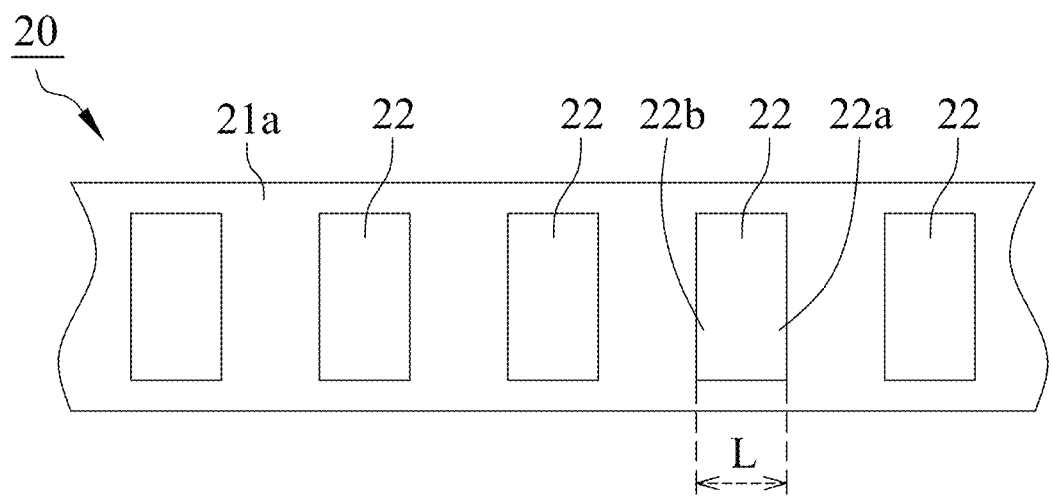
FIG. 4 is a top view diagram illustrating a heat-sink tape in accordance with an embodiment of the present invention.

With reference to FIGS. 3 and 4, a heat-sink tape 20 includes a flexible carrier 21 and a plurality of heat sinks 22. The flexible carrier 21 may be a release film having a top surface 21a and a bottom surface 21b, each of the heat sinks 22 is attached on the top surface 21a of the flexible carrier 21 temporarily by an adhesive layer 23. Each of the heat sinks 22 includes a front end 22a and a back end 22b, and a length L is defined between the front end 22a and the back end 22b. Preferably, the flexibility of the flexible carrier 21 is less than or equal to the flexibility of each of the heat sinks 22.

Figure 5:
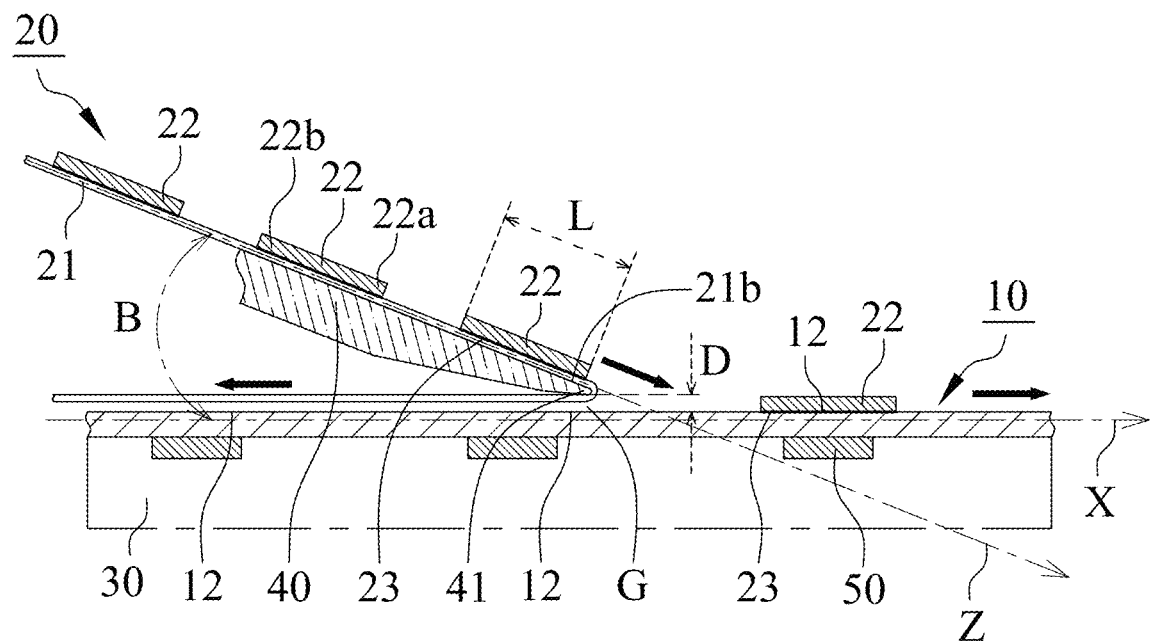
FIGS. 5 to 9 are schematic diagrams illustrating how to use a holder to attach heat sinks to a circuit tape in accordance with an embodiment of the present invention.

With reference to FIGS. 1 and 5, in a method of heat sink attachment of the present invention, the circuit tape 10 is conveyed along a first direction X and the heat-sink mounting area 12 on each of the circuit board units 11 is visible (exposed). In this embodiment, the circuit tape 10 is installed on a conveyor 30 of an attachment device, the conveyor 30 is configured to convey the circuit tape 10 along the first direction X.

Figure 6:
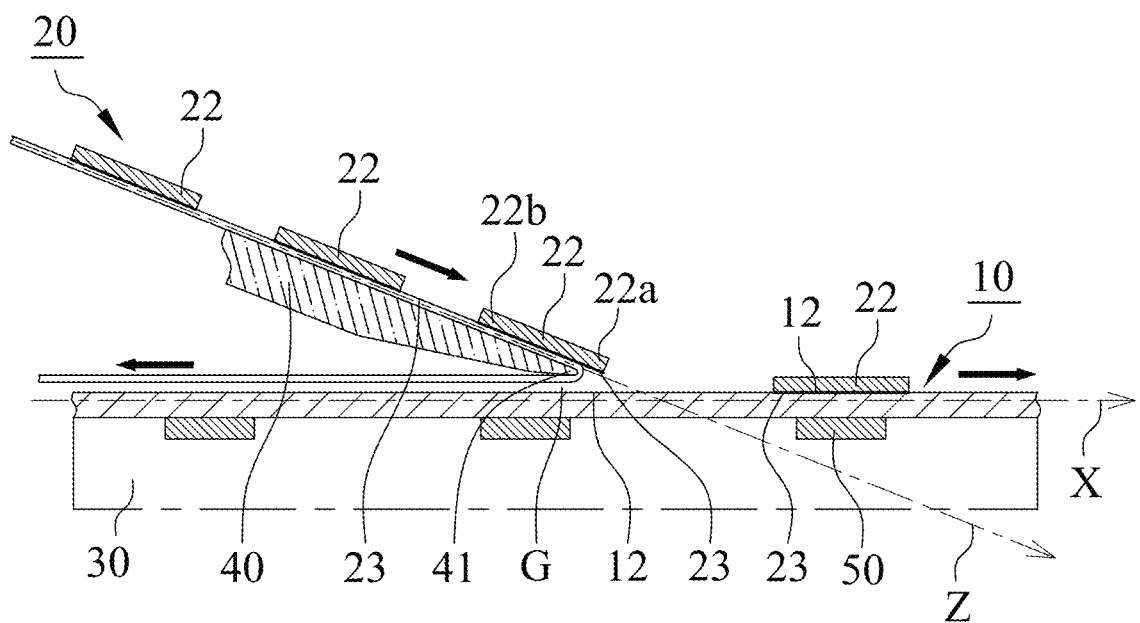

With reference to FIGS. 1, 5 and 6, the heat-sink tape 20 is installed on a holder 40 of the attachment device, the holder 40 is positioned above the circuit tape 10. The holder 40 includes an abutment portion 41, and the heat-sink tape 20 is put on the abutment portion 41 via the bottom surface 21b of the flexible carrier 21. A gap G exists between the abutment portion 41 and the circuit tape 10, preferably, a height D of the gap G is less than or equal to the length L. The flexible carrier 21 is moved along a second direction Z intersected with the first direction X to convey the heat sinks 22. After passing the abutment portion 41, the flexible carrier 21 is penetrated through the gap G and moved toward a direction of an included angle B between the first direction X and the second direction Z so as to allow the heat sinks 22 to be passed through the abutment portion 41 in sequence. The included angle B is preferably between 20 and 30 degrees.

Figure 7:
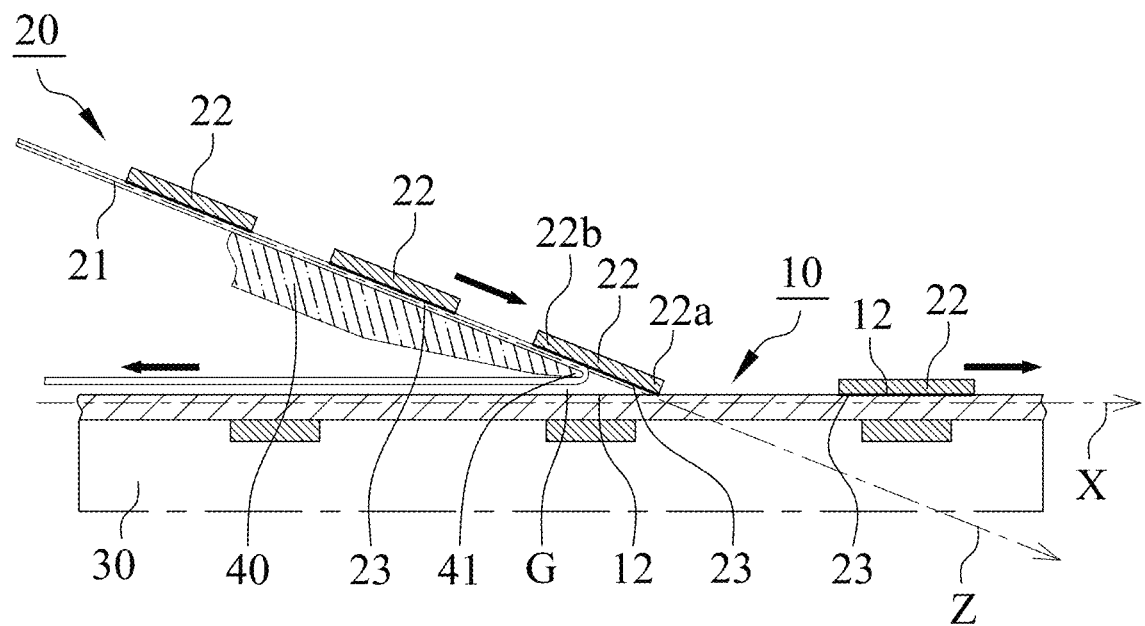

With reference to FIGS. 6 and 7, the flexible carrier 21 passing through the abutment portion 41 and the gap G is moved toward the direction of the included angle B to allow the front end 22a and the back end 22b of each of the heat sinks 22 to pass through the abutment portion 41 successively. When the front end 22a is passed through the abutment portion 41, the adhesive layer 23 under the front end 22a is peeled from the flexible carrier 21 and the front end 22a is moved toward the circuit tape 10 to contact the heat-sink mounting area 12 on the circuit tape 10 such that the front end 22a is able to be attached to the heat-sink mounting area 12 with the help of the adhesive layer 23. The adhesive layer 23 under the back end 22b is also peeled from the flexible carrier 21 and the back end 22b is also attached to the heat-sink mounting area 12 by the adhesive layer 23 when the front end 22a has been contacted and attached to the heat-sink mounting area 12. In this embodiment, owing to the height D of the gap G is not higher than the length L, the front end 22a and the back end 22b can contact the heat-sink mounting area 12 on the circuit tape 10 sequentially while the heat sink 22 is peeled from the flexible carrier 21. In this embodiment, when the heat sink 22 is completely peeled from the flexible carrier 21, the flexible carrier 21 passing through the abutment portion 41 and the gap G is moved to between the holder 40 and the circuit tape 10 where no heat sink is attached yet and then stowed on a reel (not shown).

Figure 8:
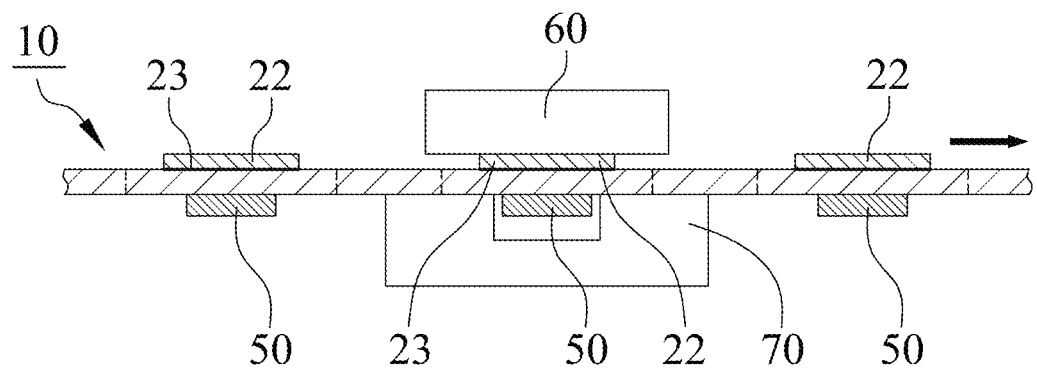
Figure 9:
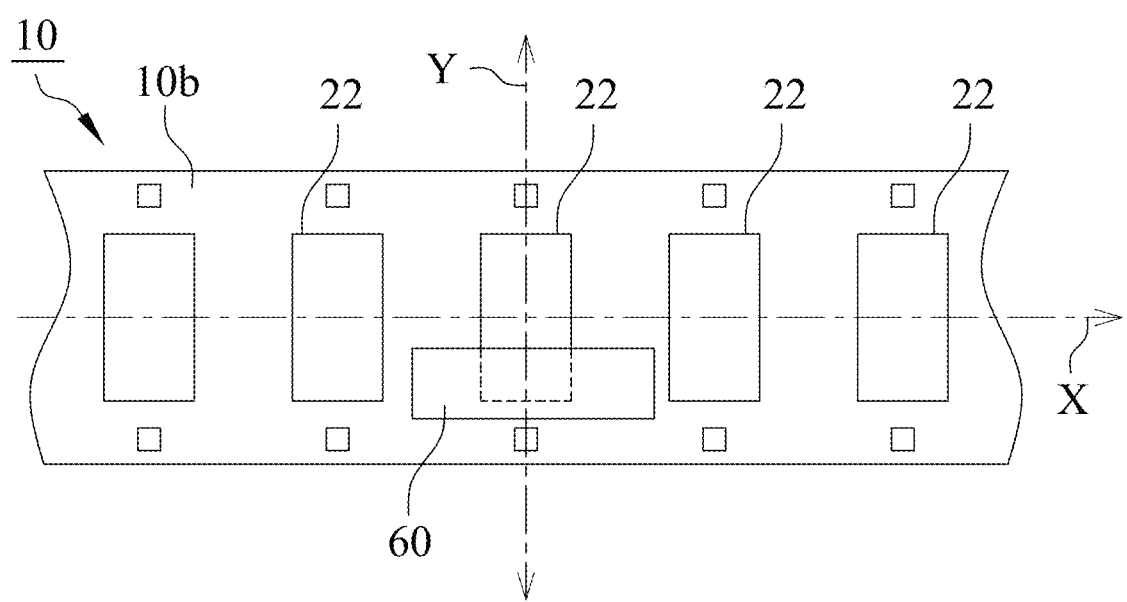

With reference to FIG. 8, a compressing member 60 of the attachment device is provided for compressing the heat sinks 22 on the circuit tape 10 after placing the heat sinks 22 on the heat-sink mounting area 12 such that each of the heat sinks 22 is attached to the heat-sink mounting area 12 on each of the circuit board units 11 by the adhesive layer 23. The compressing member 60 is, but not limited to, a roller. As shown in FIG. 9, the compressing member 60 is provided to compress each of the heat sinks 22 along a third direction Y perpendicular to the first direction X. In this embodiment, the compressing member 60 is movably mounted on a frame (not shown) and the frame is moved along the third direction Y with the compressing member 60 to allow the compressing member 60 to roll on and compress the heat sinks 22, respectively. The attachment device preferably further includes a compressing support member 70. The compressing member 60 and the compressing support member 70 are located both sides of the circuit tape 10, respectively. The compressing support member 70 is provided for supporting the circuit tape 10 when each of the heat sinks 22 is compressed by the compressing member 60.

After passing through the abutment portion 41 of the holder 40, each of the heat sinks 22 on the moving heat-sink tape 20 is able to be peeled from the flexible carrier 21 and be attached to the heat-sink mounting area 12 of the moving circuit tape 10 automatically and successively. The present invention resolves the problems resulted from a nozzle used to suck heat sinks in the prior art, such as heat sink warpage and misplacement caused by abnormal suction (too high or too low).

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A method of heat sink attachment, comprising:
   conveying a circuit tape along a first direction, the circuit tape includes a plurality of circuit board units, a heat-sink mounting area is defined on each of the circuit board units; and
   installing a heat-sink tape on a holder, the holder is located above the circuit tape and includes an abutment portion, a gap exists between the abutment portion and the circuit tape, the heat-sink tape includes a flexible carrier and a plurality of heat sinks attached to a top surface of the flexible carrier temporarily by an adhesive layer, the heat-sink tape is placed on the abutment portion via a bottom surface of the flexible carrier, the flexible carrier is provided to convey the heat sinks successively along a second direction intersecting with the first direction, and the flexible carrier is able to be moved through the gap and toward a direction of an included angle between the first and second directions after passing through the abutment portion, the adhesive layer under a front end and a back end of each of the heat sinks is peeled from the flexible carrier when the front end and the back end of each of the heat sinks are passed through the abutment portion successively such that each of the heat sinks is able to separate from the flexible carrier, and the front end and the back end of each of the heat sinks separated from the flexible carrier successively are able to attach to the heat-sink mounting area of each of the circuit board units successively by the adhesive layer.

2. The method in accordance with claim 1, wherein a length is defined between the front end and the back end of each of the heat sinks, a height of the gap is less than or equal to the length.

3. The method in accordance with claim 1, wherein the flexible carrier is located between the holder and the circuit tape where no heat sink is attached yet after passing through the abutment portion and the gap.

4. The method in accordance with claim 3, wherein a compressing member is provided to compress each of the heat sinks on the circuit tape along a third direction perpendicular to the first direction after each of the heat sinks is attached to the heat-sink mounting area of each of circuit board units.

5. The method in accordance with claim 4, wherein a compressing support member is provided to support the circuit tape when the compressing member compresses each of the heat sinks on the circuit tape.

6. The method in accordance with claim 1, wherein the circuit tape is installed on a conveyor that is provided to convey the circuit tape along the first direction, the heat-sink mounting area of each of the circuit board units is exposed.

7. The method in accordance with claim 1, wherein the included angle is between 20 and 30 degrees.

8. The method in accordance with claim 1, wherein a flexibility of the flexible carrier is less than or equal to a flexibility of each of the heat sinks.

* * * * *